(12) United States Patent
Grange et al.

(10) Patent No.: US 10,562,096 B2
(45) Date of Patent: Feb. 18, 2020

(54) INSTALLATION FOR MANUFACTURING A PART BY IMPLEMENTING A BRIDGMAN METHOD

(71) Applicants: SAFRAN, Paris (FR); SAFRAN AIRCRAFT ENGINES, Paris (FR)

(72) Inventors: David Grange, Paris (FR); Gilles Martin, Pontoise (FR)

(73) Assignees: SAFRAN, Paris (FR); SAFRAN AIRCRAFT ENGINES, Paris (FR)

(*) Notice: Subject to any disclaimer, the term of this patent is extended or adjusted under 35 U.S.C. 154(b) by 186 days.

(21) Appl. No.: 15/864,546

(22) Filed: Jan. 8, 2018

(65) Prior Publication Data

US 2018/0193906 A1    Jul. 12, 2018

(30) Foreign Application Priority Data

Jan. 9, 2017 (FR) .................................... 17 50167

(51) Int. Cl.
*B22D 27/04* (2006.01)

(52) U.S. Cl.
CPC .................................... *B22D 27/045* (2013.01)

(58) Field of Classification Search
CPC ....... B22D 27/04; B22D 27/045; C30B 11/00; C30B 11/003

USPC ................................ 164/122.1, 122.2, 338.1
See application file for complete search history.

(56) References Cited

U.S. PATENT DOCUMENTS

| 3,714,977 A * | 2/1973 | Terkelsen ............. | B22D 27/045 164/122.1 |
| 6,868,893 B2 * | 3/2005 | Shimohata et al. . | B22D 27/045 164/122.1 |
| 10,082,032 B2 * | 9/2018 | Naik ..................... | B22D 25/02 |

FOREIGN PATENT DOCUMENTS

| EP | 0 278 762 A2 | 8/1988 |
| GB | 2 404 353 A | 2/2005 |
| JP | 2002-144019 A | 5/2002 |

OTHER PUBLICATIONS

Search Report as issued in French Patent Application No. 1750167, dated Oct. 24, 2017.

* cited by examiner

*Primary Examiner* — Kevin P Kerns

(74) *Attorney, Agent, or Firm* — Pillsbury Winthrop Shaw Pittman LLP

(57) ABSTRACT

An installation for manufacturing a part by implementation of a Bridgman method includes in particular a mold intended to receive a melted material and a thermal screen movable with respect to the mold intended to be positioned in front of the solidification front during the directional solidification.

7 Claims, 7 Drawing Sheets

INSTALLATION FOR MANUFACTURING A PART BY IMPLEMENTING A BRIDGMAN METHOD

CROSS-REFERENCE TO RELATED APPLICATIONS

This application claims priority to French Patent Application No. 1750167, filed Jan. 9, 2017, the entire content of which is incorporated herein by reference in its entirety.

FIELD

The invention relates to an installation for the implementation of a Bridgman method as well as method for manufacturing a part implementing such an installation.

BACKGROUND

The Bridgman method can be used to accomplish the directional solidification of a single-crystal part. This technique allows the solidification front to be made to progress in one direction, from one end to another of the part. The oven that is implemented in this method comprises a hot zone, the temperature of which is greater than the melting temperature of the material intended to form the part, as well as a cold zone regulated to a temperature allowing solidification of the melted material. The temperature of the hot zone can be maintained by radiation by susceptors heated by induction. A thermal screen can be present at the border between the cold and hot zones. There exists a strong temperature gradient between these two zones.

To solidify a part in a directional manner, the material is introduced in the melted state into a mold present in the hot portion of the oven. The mold thus filled by the melted material is progressively displaced in the direction of the cold zone. The strong temperature gradient allows a solidification front to be obtained that is localized at the border between the hot zone and the cold zone.

It is however desirable to improve the properties and the quality of the parts obtained by implementing a Bridgman method.

The invention aims to respond to the aforementioned need.

SUMMARY

To this end, the invention proposes, according to a first aspect, an installation for manufacturing a part by implementation of a Bridgman method, the installation comprising:

at least one mold intended to receive a melted material, the mold being present in a heating zone situated inside an enclosure, a cooling zone situated inside the enclosure and separated from the heating zone by a first thermal screen, the first thermal screen being fixed with respect to the enclosure and being situated on a first side of the mold, the heating zone being superimposed on the cooling zone along an axis of the enclosure, a first movement system configured to move the mold in the enclosure from the heating zone to the cooling zone along the axis of the enclosure, a second thermal screen movable with respect to the mold, distinct from the first thermal screen and situated on a second side of the mold opposite to the first side, and a second movement system, distinct from the first movement system, configured to move the second thermal screen in the enclosure along the axis of the enclosure.

Studies carried out by the inventors have made it possible to observe that the properties of the part to be obtained are dependent on the aspect of the local temperature gradient at the solidification front and that the Bridgman techniques of the prior art do not allow an optimal temperature gradient to be obtained during the directional solidification. More precisely, the inventors have noted that it is desirable, so as to improve the quality of the part obtained by directional solidification, that this thermal gradient have a minimal component in the direction perpendicular to the solidification direction. In other words, it is desirable to have a maximum tendency toward a perfectly stabilized temperature gradient, that is only directed along the solidification direction. The fact of using one or more thermal screens, fixed with respect to the mold, stabilizes the temperature gradient only at certain moments of the solidification, but not at others.

This observation is illustrated by FIGS. 1 and 2 which reproduce, schematically, results of numerical simulations showing the appearance of the isothermal curves at the solidification front S for a vertical upward advance of the latter (arrow F) within the scope of a Bridgman method with the thermal screen fixed with respect to the mold. The installation illustrated in FIGS. 1 and 2 comprises a thermal screen 10 fixed with respect to the enclosure separating the hot zone (upper zone) from the cold zone (lower zone). The installation also includes a heating system 4. This installation also comprises at least one thermal screen 14 connected to the mold and situated on the side opposite to the screen 10. The thermal screen 14 is therefore fixed with respect to the mold. FIG. 1 shows that the thermal screen 14 stabilizes the temperature gradient when the solidification front S is at the screen 14. In this case, the isothermal curves are substantially horizontal and the thermal gradient is therefore substantially directed in the direction F. At a prior instant on the other hand, these isothermal curves would have a noticeable inclination and therefore a significant horizontal thermal gradient (FIG. 2). In the latter case, the ideal aspect for the thermal gradient moves away. In fact, the thermal screen 14 generates a cold zone below it which destabilizes the thermal gradient when the solidification front S is below the screen 14. Thus, the inventors have noted that the implementation of the thermal screen 14, fixed with respect to the mold, does not allow the temperature gradient to be stabilized at all times during solidification. In particular, the inventors have noted that the side of the mold $C_2$ opposite to the thermal screen 10 separating the hot zone from the cold zone has excessive cooling at certain times during solidification with respect to the side of the mold $C_1$ situated on the side of this screen 10 (FIG. 2). Such a destabilization of the thermal gradient can lead to the generation of flaws in the part obtained after solidification.

The invention proposes an installation allowing the stability of the thermal gradient to be improved during directional solidification. The first and second thermal screens are situated on either side of each mold. The implementation of the second thermal screen and of the second movement system beneficially allows a thermal screen to be available, movable with respect to the mold, allowing the solidification front to be followed during directional solidification. The fact of being able to modify the position of the second thermal screen during directional solidification so as to position it in front of the solidification front makes it possible for the thermal gradient to be additionally stabilized during solidification, to avoid excessive cooling of the side of the mold opposite to the first thermal screen and to thus improve the quality of the parts obtained.

In one exemplary embodiment, the installation also comprises a third thermal screen, fixed with respect to the enclosure, distinct from the first and second thermal screens, the third thermal screen being present in the heating zone and being superimposed on the first thermal screen along the axis of the enclosure.

Such a feature is beneficial in order to limit radiation losses to the lower portion of the enclosure.

In one exemplary embodiment, the installation further comprises:

a fourth thermal screen movable with respect to the mold and distinct from the first and second thermal screens, and possibly from the third thermal screen when the latter is present, the fourth thermal screen being situated on the second side of the mold and being superimposed on the second thermal screen along the axis of the enclosure, the width of the fourth thermal screen being less than the width of the second thermal screen, and a third movement system, distinct from the first and second movement systems, configured to move the fourth thermal screen along the axis of the enclosure independently of the second thermal screen.

The "fourth thermal screen" will hereafter be called either the "fourth thermal screen" or the "additional thermal screen."

Such a feature is beneficial when the mold(s) used have shapes or dimensions leaving insufficient space for the second thermal screen to follow the solidification front over the entire duration of solidification. Thus, according to this exemplary embodiment, the second thermal screen will follow the solidification front during a first directional solidification phase and will be positioned in front of this front during this phase. As soon as the second thermal screen can no longer continue to follow the solidification front due to insufficient space delimited by the mold(s), the movement of the second thermal screen will be stopped. The movement of the fourth thermal screen will then be initiated using the third movement system so that the fourth thermal screen, narrower than the second thermal screen, continues to follow the solidification front so as to be positioned in front of the latter. Such a feature therefore makes it possible to ensure stability of the thermal gradient throughout of the directional solidification even when the geometry of the molds is such that the second thermal screen cannot follow the solidification front throughout the method.

In one exemplary embodiment, the installation comprises a plurality of molds intended to receive the melted material and present in the heating zone, the molds being present around the second thermal screen, the installation further comprising a heating system configured to heat the heating zone, the heating system and the first thermal screen being present around the molds.

An aspect of the present invention also relates to a method for manufacturing at least one part by implementation of a Bridgman method and of the installation described above, the method comprising at least:

the introduction of a melted material into the at least one mold, the directional solidification of the melted material by moving the at least one mold comprising the melted material from the heating zone toward the cooling zone along the axis of the enclosure by activating the first movement system, and the movement of the second thermal screen along the axis of the enclosure by activating the second movement system so as to position the second thermal screen in front of the solidification front of the melted material during all or a portion of the directional solidification.

In one exemplary embodiment, the second thermal screen is moved by positioning it in front of the solidification front during a first phase of the directional solidification, then the fourth thermal screen is moved along the axis of the enclosure by actuation of the third movement system so as to position the fourth thermal screen in front of the solidification front of the melted material during a second phase of the directional solidification.

In one exemplary embodiment, the part can be a turbomachine part. In particular, the part can be a turbomachine blade, a distributor or a sector of a ring. In one exemplary embodiment, the part manufactured is a part of an aeronautical turbomachine. As a variant, it is a part of a land-based turbine.

In one exemplary embodiment, the melted material is a metal material. As a variant, the melted material is a ceramic material, for example a ceramic material of eutectic composition.

The melted ceramic material can for example include at least: alumina $Al_2O_3$, zirconia $ZrO_2$, a rare earth oxide, an aluminum and rare earth garnet $RE_3Al_5O_{12}$ or a perovskite $REAlO_3$, where RE designates a rare earth element. The rare earth oxide can have the chemical formula $RE_2O_3$ with RE as defined above, and can for example be $Y_2O_3$ or $La_2O_3$. The ceramic material can, for example, include alumina and zirconia. The ceramic material can have a eutectic composition and can for example be selected among the following mixtures: $Al_2O_3$—$ZrO_2$, $Al_2O_3$—YAG (YAG corresponding to $Y_3Al_5O_{12}$), $RE_3Al_5O_{12}$—$Al_2O_3$ where RE is a rare earth element, $Al_2O_3$—$RE_3Al_5O_{12}$—$ZrO_2$ and $Al_2O_3$—YAG-$ZrO_2$.

As a variant, the melted material can be a metal material, and be for example a superalloy such as a nickel superalloy.

BRIEF DESCRIPTION OF THE DRAWINGS

Other features and benefits of the invention will be revealed by the following description, given without limitation, with reference to the appended drawings, in which.

DETAILED DESCRIPTION OF EMBODIMENTS

Figure 1:
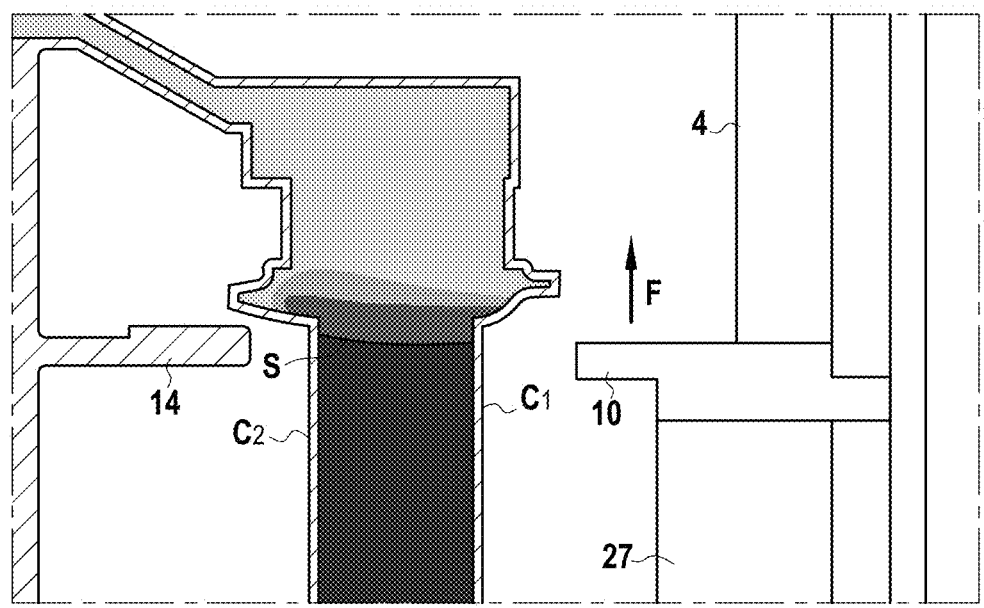
FIGS. 1 and 2 are results of numerical simulations schematically reproduced showing the aspect of the isotherms at the solidification front at different instants in the implementation of a Bridgman method accomplished with the help of an installation not part of the invention.
Figure 2:
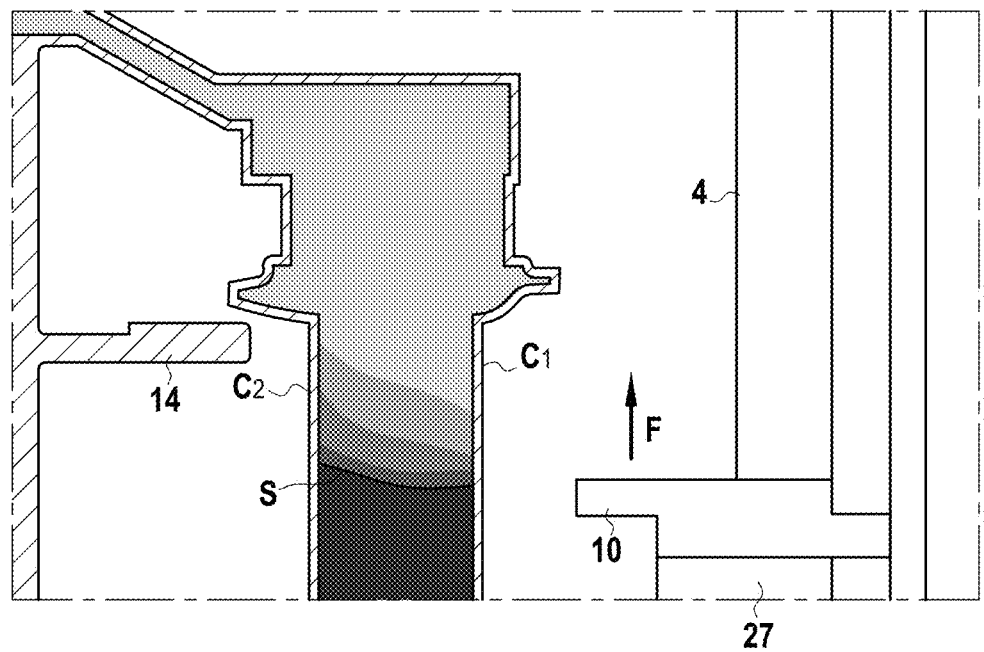
Figure 3:
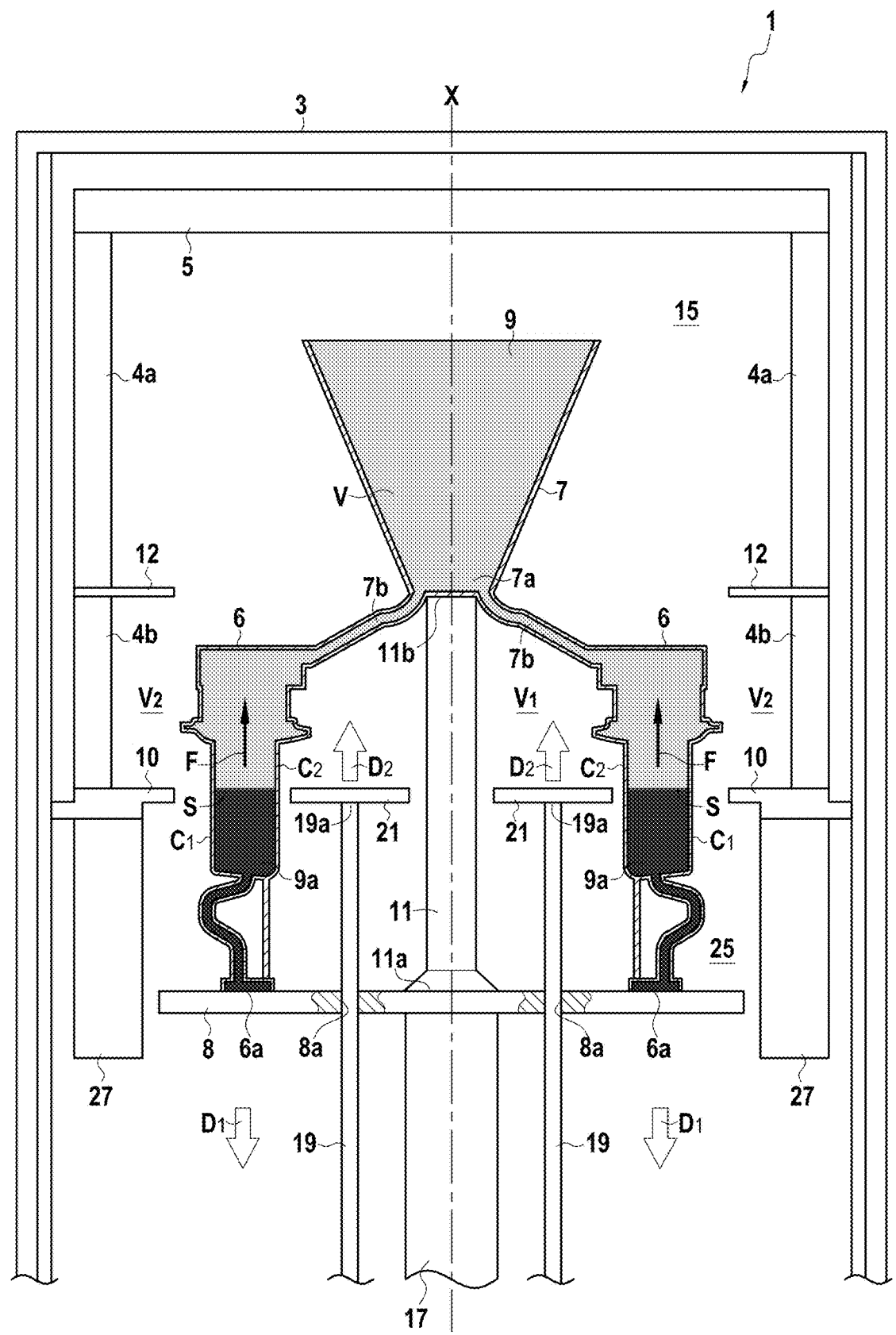
FIG. 3 illustrates schematically and partially a first example of an installation according to an embodiment of the invention.

FIG. 3 illustrates a first example of an installation 1 according to an embodiment of the invention. The installation 1 consists of an oven for manufacturing a part by implementing a Bridgman method. The part obtained can be made of a refractory material, for example metallic or of a ceramic material, for example a ceramic material of eutectic composition. The part obtained can have a crystalline microstructure. The part obtained can for example be a turbomachine part, such as a turbomachine blade. In the installation examples illustrated, each of the molds 6 has a shape allowing the manufacture of a turbomachine blade.

The installation 1 comprises an enclosure 3 defining an interior volume in which the Bridgman method is intended to be carried out. The enclosure 3 is fixed during the directional solidification. A reservoir 7 defining a volume V containing melted material 9 is present inside the enclosure 3. The reservoir 7 has a bottom 7a which is in communication with a plurality of channels 7b, each of which leads into a distinct mold 6. Thus, the melted material 9 passes through the channels 7b under the influence of gravity to be transferred to the molds 6 and fill the latter. The molds 6 each have the shape of the part to be obtained. Within the same installation, the molds 6 can be identical or can, as a variant, be different in terms of shape and/or of dimensions. The example installation 1 illustrated comprises a plurality of molds 6, but this installation does not depart from the scope of the invention if it comprises only a single mold.

The molds 6 are present in a heating zone 15 situated in the upper portion of the interior volume defined by the enclosure 3. In the example illustrated, the molds 6 are positioned circumferentially around the axis X of the enclosure 3. A heating system 4a and 4b is present in the interior of the enclosure 3 and is configured to heat the heating zone 15 so as to melt the material. The heating system can comprise a first 4a and a second 4b susceptor as well as an inductor (not shown). When the inductor has a current passing through it, the inductor creates an electromagnetic field which induces in the susceptors 4a and 4b a current causing the heating of the latter. Each of the susceptors 4a and 4b delimits the heating zone 15 laterally. The first susceptor 4a is superimposed on the second susceptor 4b along the axis of the enclosure X. The susceptors 4a and 4b are illustrated separated by a thermal screen 12 in the example. The thermal screen 12 (third thermal screen) is fixed with respect to the enclosure 3 and therefore remains in the same position during the directional solidification. The upper portion of the heating zone 15 is closed by an upper wall 5.

The installation 1 further comprises a cooling zone 25 which is separated from the heating zone 15 by a first thermal screen 10. The first thermal screen 10 is fixed with respect to the enclosure 3 and therefore remain in the same position during the directional solidification. The third thermal screen 12 is superimposed on the first thermal screen 10 along the axis X of the enclosure. The third thermal screen 12 is situated above the molds 6. A portion at least of the mold is present in the enclosure 3 at a height comprised between the height at which the first thermal screen 10 is present and the height at which the third thermal screen 12 is present. These heights are measured along the axis X of the enclosure 3. The presence of the third thermal screen 12 is, however, optional. The cooling zone 25 is situated in the lower portion of the interior volume defined by the enclosure 3. The heating zone 15 is superimposed on the cooling zone 25 along the axis X of the enclosure. The cooling zone 25 comprises a cooling system 27 in which a cooling fluid circulates. The system 27 makes it possible to cool the cooling zone 25 and to maintain its temperature at a value allowing the solidification of the melted material 9. The cooling system 27 can, as illustrated, surround the cooling zone 25. The cooling system 27 delimits laterally the cooling zone 25. The cooling system 27 is situated below the first thermal screen 10. The first thermal screen 10 is situated between the heating system 4a and 4b and the cooling system 27.

Each of the molds 6 is connected to a first movement system configured to move the molds 6 from the heating zone 15 toward the cooling zone 25. More precisely, each mold 6 has a lower end 6a firmly attached to a movable support 8. The movable support 8 has, in the example illustrated, the shape of a plate, but the support 8 does not depart from the scope of the invention if it has a non-planar shape. The first movement system comprises a first actuator 17 configured to lower the support 8, and therefore the molds 6, in the direction D1 which is parallel to the axis X. The movement of the molds 6 in the direction D1 allows the melted material 9 to be cooled and to accomplish its directional solidification so as to obtain the part implementing the Bridgman method.

Represented in FIG. 3 is a configuration of the installation 1 during the implementation of the Bridgman method where it is seen that each of the molds 6 contains a first, solidified portion 9a situated on the side of the cooling zone 25, and a second, melted portion 9 situated on the side opposite this zone 25. The solidification front S separates the solidified portion 9a from the melted zone 9 and moves along the direction F during the process.

The installation 1 further comprises, in the example illustrated, an additional support element 11 extending along the axis X. The element 11 comprise a lower end 11a firmly attached to the movable support 8 and an upper end 11b firmly attached to the reservoir 7. The element 11 beneficially allows reinforcement of the assembly constituted by the molds 6 and the reservoir 7. The presence of this element 11 is, however, optional. When the movable support 8 is lowered in the direction D1, the assembly constituted by the molds 6, the channels 7b, the reservoir 7 and the additional element 11, when it is present, is moved as a whole toward the cooling zone 27.

In the example illustrated, the first thermal screen 10 is fixed and surrounds the molds 6. The first thermal screen 10 has an annular shape. The heating system 4a and 4b also surrounds the molds 6 in the example illustrated. Thus, in this example, the molds 6 each have an external side $C_1$ present in front of the first thermal screen 10 and an internal side $C_2$ situated on the opposite side of the first thermal screen 10. The internal side $C_2$ is situated on the side of the internal volume V1 of the heating zone 15 surrounded by the molds 6. The internal side $C_2$ is situated on the side of the center of the heating zone. The external side $C_1$ is situated on the side of the external volume V2 of the heating zone 15 surrounding the molds 6. The external side $C_1$ is situated on the side of the periphery of the heating zone 15. The external $C_1$ and internal $C_2$ sides correspond, for each mold, to two diametrically opposed sides of the mold.

The installation 1 illustrated in FIG. 3 also comprises a second thermal screen 21 with an annular shape. The second thermal screen 21 is present around the reinforcing element 11 (and the axis X). This second thermal screen 21 is present in front of the internal side $C_2$ of each of the molds 6. The second thermal screen 21 is movable with respect to the molds 6 and is intended to be moved in the enclosure 3 along the axis X during the Bridgman method so as to be positioned in front of the solidification front S (at the same height as the latter). The fact of positioning the second thermal screen 21 in front of the solidification front S beneficially allows reducing, even eliminating, the horizontal thermal gradient and obtaining a part having improved quality and properties.

In order to allow the movement of the second thermal screen 21, the installation 1 comprises a second movement system which comprises a plurality of actuators 19. Each of these actuators 19 is connected at its end 19a to the second thermal screen 21 so as to allow the movement of the latter along the axis X. Each of the actuators 19 has at its end 19a a support system on which is placed the second thermal screen 21. One example of the support system will be described hereafter. The actuators 19 of the second movement system extend along the axis X through openings 8a provided in the movable support 8. The actuators 19 are positioned circumferentially around the axis X. In the configuration illustrated in FIG. 3, an upward movement (direction D2) of the second thermal screen 21 is shown, following the actuation of the actuators 19 but more generally the second thermal screen 21 can be caused to be moved upward or downward depending on the position of the solidification front during the Bridgman method. The materials constituting the fixed or movable thermal screens implemented are known per se. The thermal screens can for example be made of carbon or of carbon felt.

The implementation of a Bridgman method using the installation of FIG. 3 will now be briefly described. The heating system 4a and 4b is activated so as to melt the material present in the reservoir 7. The melted material 9 then flows under the influence of gravity so as to fill the molds 6. The first movement system 17 is then actuated so as to lower the movable support 8 and the molds 6. The directional solidification of the melted material 9 is then accomplished due to moving the melted material 9 closer to the cooling zone 25. During the process, the interior of the enclosure 3 is held under vacuum. During this solidification, the solidification front S moves along the direction materialized by the arrow F. During the directional solidification, the second thermal screen 21 is displaced so as to be positioned at the same height as the solidification front S so as to stabilize the thermal gradient at the front S. The signal coming from a device for detecting or estimating the position of the solidification front is transmitted to a control module so as to actuate the second movement system and vary the position of the second thermal screen. The position of the solidification front can be detected based on the temperature measurement carried out by thermocouples positioned in the vicinity of each of the molds. As a variant, the position of the solidification front can be estimated by numerical simulation during solidification.

Figure 4:
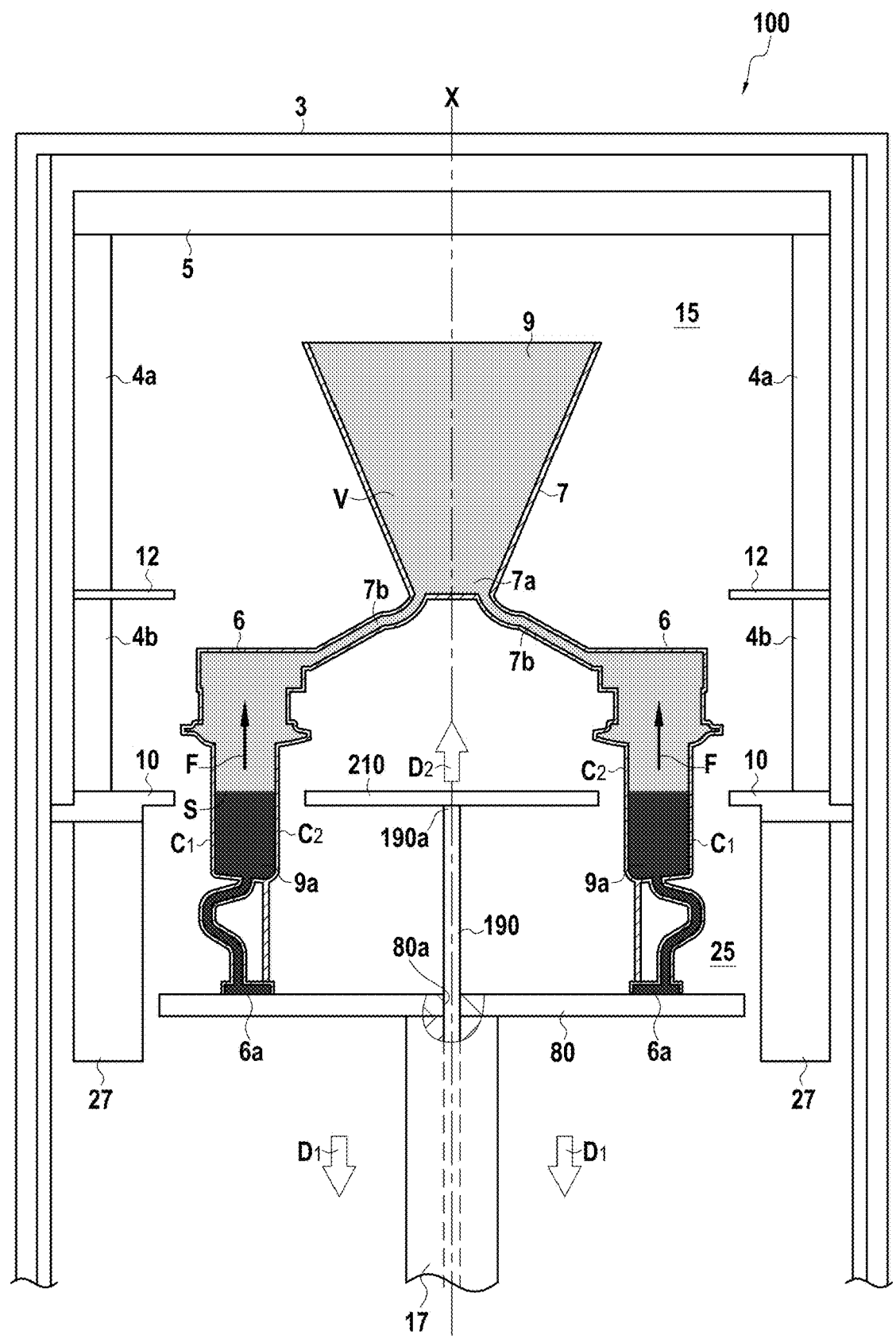
FIG. 4 illustrates schematically and partially a second example of an installation according to an embodiment of the invention.

Shown in FIG. 4 is a variant installation 100 which differs from that of FIG. 3 in that the second thermal screen 210 no longer has an annular shape, but rather has the shape of a disk. In the same manner as described above, an actuator 190 of the second movement system passes through the movable support 80 through the opening 80a. In the example illustrated, the actuator 190 passes through the movable support 80 at the center of the latter. The actuator 190 is configured to slide inside the actuator 17, ensuring putting into motion the molds 6 toward the cooling zone 25. The actuators 17 and 190 extend along the same axis, corresponding in the illustrated example to the axis X. The second thermal screen 210 is placed on the actuator at its end 190a. The actuator 190 allows the second thermal screen 210 to be moved in the direction D2 so as to position this second thermal screen in front of the solidification front S during the directional solidification. It will also be noted that the example installation 100 of FIG. 4 does not implement the additional reinforcement element.

FIGS. 5A to 5D illustrate the positioning of the second thermal screen 210 on the second movement system in the case of the installation 100 of FIG. 4, it being understood that a similar method can be used with the actuators 19 of the installation 1 of FIG. 3.

Figure 5A:
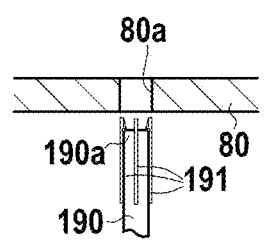
FIGS. 5A to 5D illustrate schematically a way of positioning the second thermal screen on the second movement system.
Figure 5B:
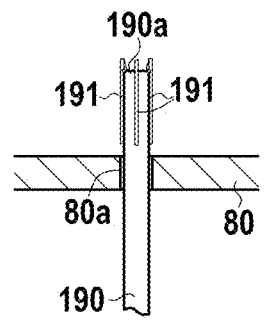
Figure 5C:
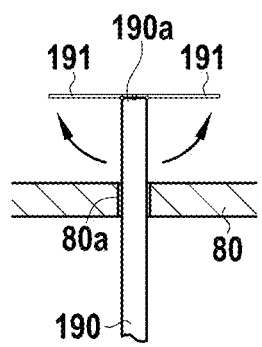
Figure 5D:
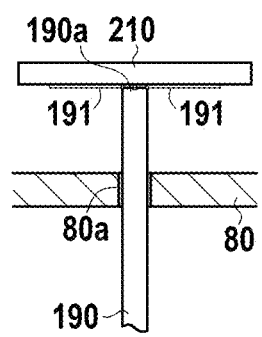

First of all, the actuator 190 is introduced at the opening 80a so as to pass through the movable support 80 (FIGS. 5A and 5B). The actuator 190 comprises a plurality of deployable rods 191 at its end 190a. The deployable rods 191 are initially retracted so as to allow the introduction of the actuator 190 through the movable support 80. After the introduction of the actuator 190 through the movable support 80, the rods 191 are then deployed so as to form a support extending transversely, for example perpendicularly, with respect to the axis of the actuator 190 (FIG. 5C). The second thermal screen 210 is then placed on the support present at the end 190a of the actuator 190 (FIG. 5D).

Figure 6:
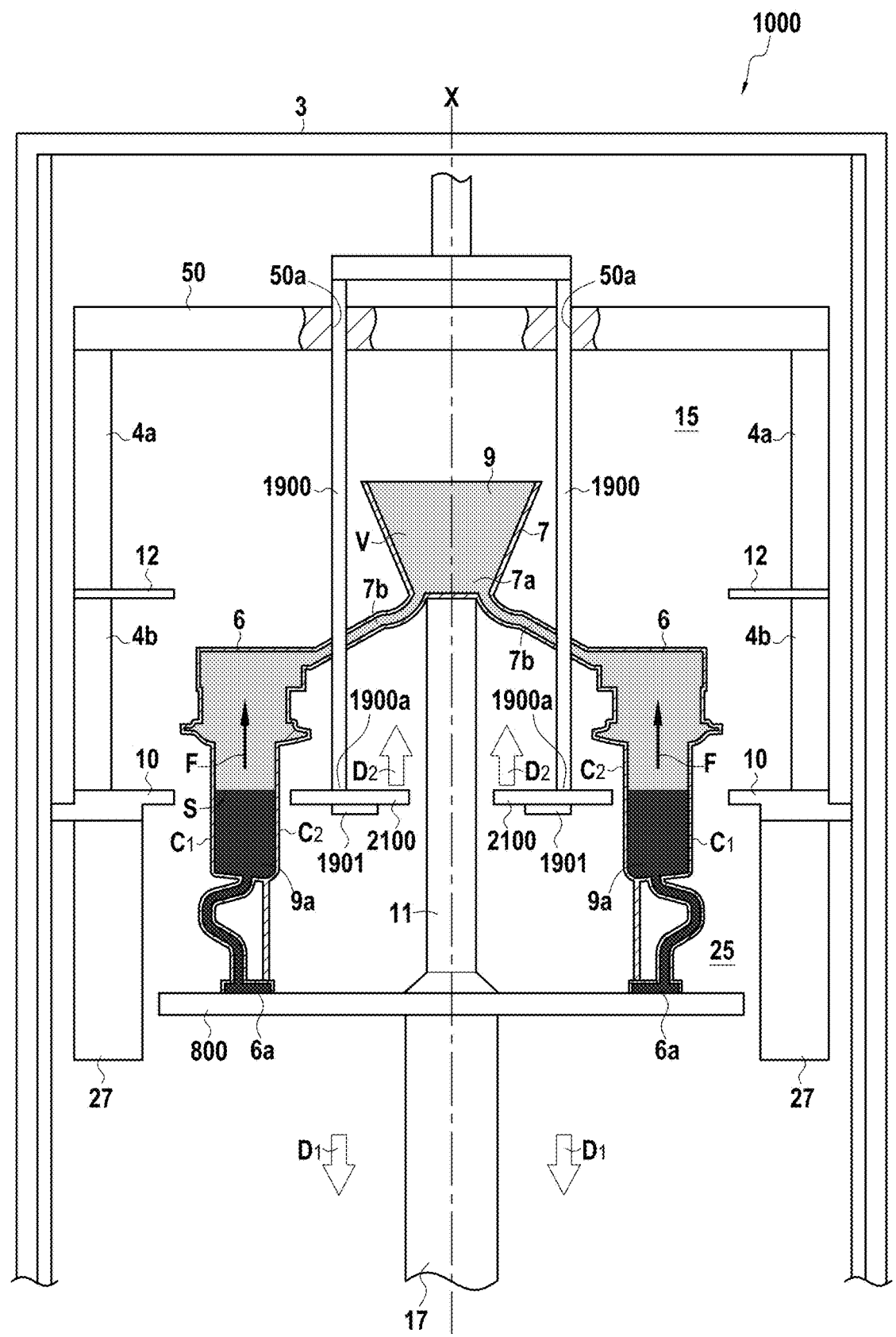
FIG. 6 illustrates schematically and partially a third example of an installation according to an embodiment of the invention.

Shown in FIG. 6 is another variant installation 1000. This installation 1000 is similar to the installation 1 of FIG. 3, except that the actuators 1900 of the second movement system pass through the upper wall 50 at a plurality of openings 50a and no longer the movable support 800. The second thermal screen 2100 has an annular shape and rests on blocks 1901 firmly attached to each actuator 1900 at the ends 1900a. The blocks 1901 extend transversely, for example perpendicularly, with respect to the actuators 1900 so as to ensure the retention of the second thermal screen 2100.

Figure 7A:
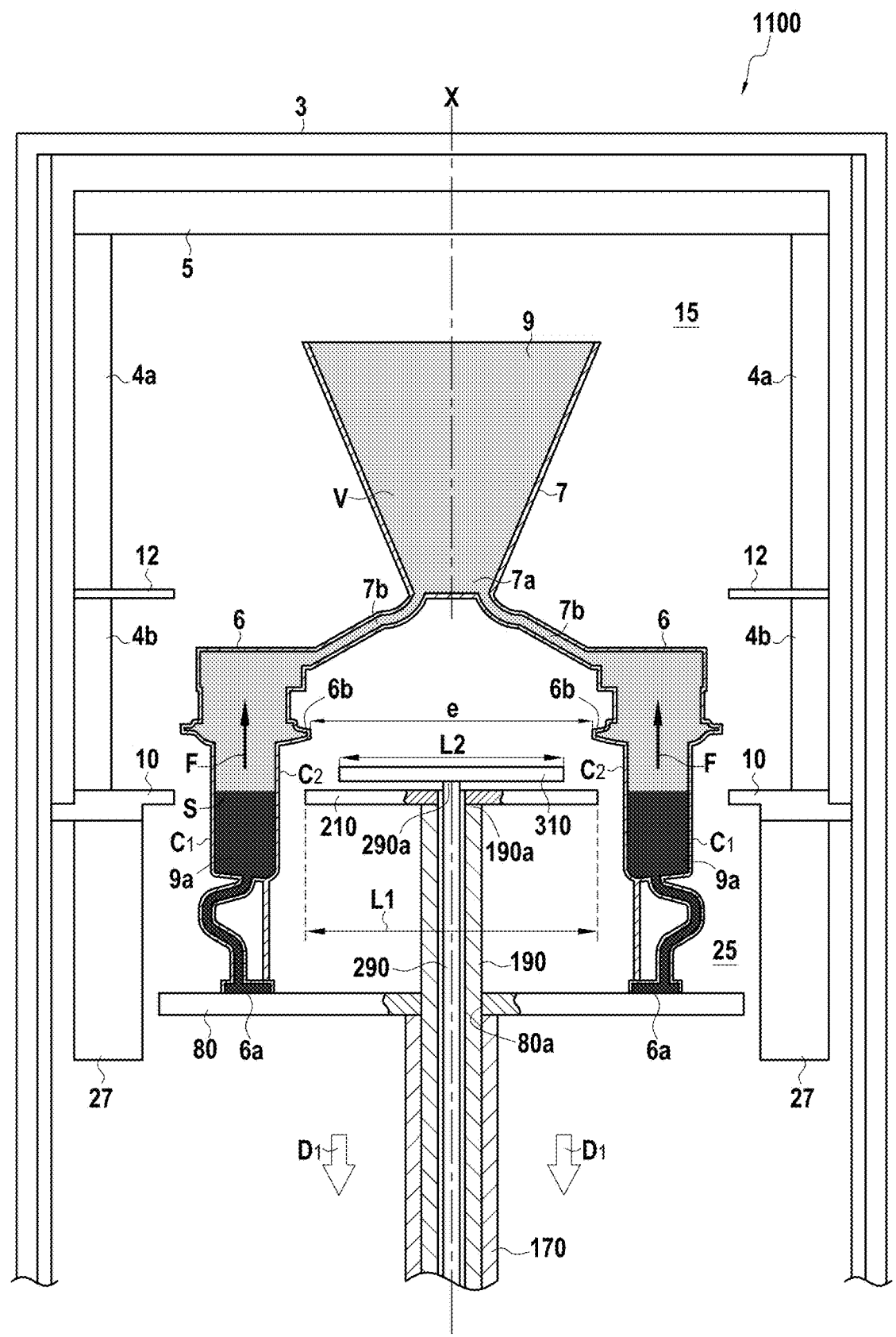
FIGS. 7A and 7B illustrate schematically and partially a fourth example of an installation according to an embodiment of the invention.
Figure 7B:
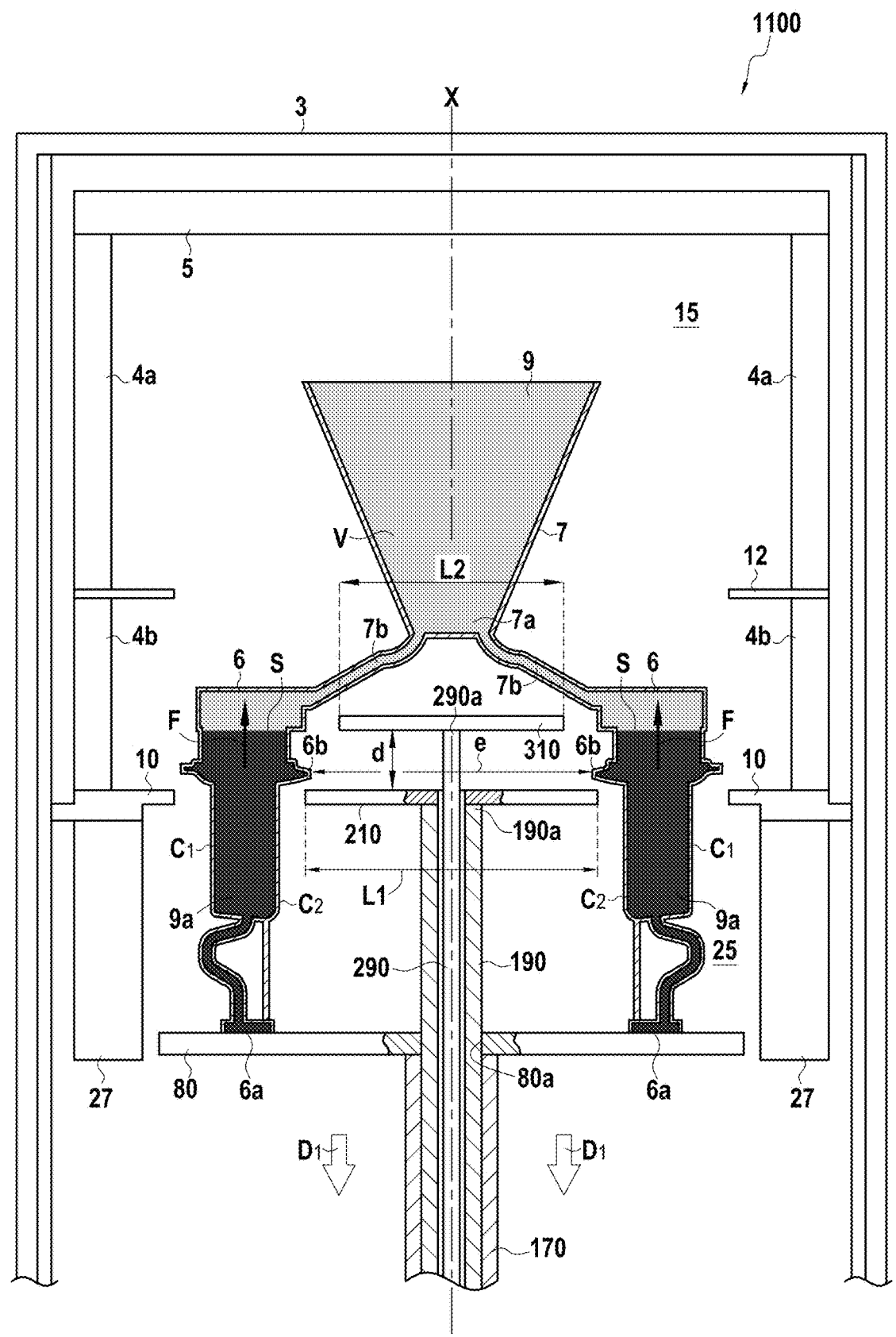

Shown in FIGS. 7A and 7B is an installation variant 1100 which comprises, in addition to the second movable thermal screen 210, a fourth thermal screen 310 that is movable with respect to the molds 6. The fourth thermal screen 310 is situated on the internal side $C_2$ of each of the molds 6. The fourth thermal screen 310 is superimposed on the second thermal screen 210 along the axis of the enclosure X. In the same manner as described above, the first movement system comprises an actuator 170 configured to lower the movable support 80 and the molds 6 in the oven so as to accomplish the solidification of the melted material 9. The second movement system comprises, in the example illustrated, an actuator 190, at the end 190a of which the second thermal screen 210 is present. The actuator 190 is configured to slide inside the actuator 170. The actuators 170 and 190 extend along the same axis, corresponding in the example illustrated to the axis X. The installation 1100 also comprises a third movement system which comprises an actuator 290 at the end 290a of which the fourth thermal screen 310 is present. The second actuator 290 is configured to slide inside the first actuator 190. The actuators 190 and 290 extend along the same axis, corresponding in the example illustrated to the axis X. The width L2 of the fourth thermal screen 310 is less than the width L1 of the second thermal screen 210. Such an installation 1100 is beneficial when the molds 6 used have a shape or dimensions leaving insufficient space for the second thermal screen 210 to follow the solidification front over the entire duration of the solidification. In fact, it can be seen in FIG. 7A that the spacing e between the molds 6 at the points 6b is less than the width L1. For this reason, the second thermal screen 210 will not be able to rise to a higher position than that of the points 6b of the molds 6. Thus, according to this exemplary embodiment, the second thermal screen 210 will follow the solidification front during a first phase of the directional solidification and will be positioned in front of this front during this first phase. Once this second thermal screen can no longer continue to follow the solidification front due to insufficient spacing e between the molds 6, the movement of the second thermal screen 210 will be stopped. The movement of the fourth thermal screen 310 will then be initiated using the third movement system so that the fourth thermal screen, narrower than the second thermal screen, continues to follow the solidification front so as to be positioned in front of the latter (see FIG. 7B and non-zero spacing d between the two thermal screens 210 and 310). The second thermal screen 210 can be held fixed during the movement of the fourth thermal screen 310. In fact, the fourth thermal screen 310 has a width L2 less than the spacing e and can therefore continue to follow the solidification front beyond the points 6b (see FIG. 7B).

In a non-illustrated variant, one could use second 210 and fourth 310 thermal screens having annular shapes.

The invention claimed is:

1. An installation for manufacturing a part by implementation of a Bridgman method, said installation comprising:
    at least one mold intended to receive a melted material, the at least one mold being present in a heating zone situated inside an enclosure;
    a cooling zone situated inside the enclosure and separated from the heating zone by a first thermal screen, the first thermal screen being fixed with respect to the enclosure and being situated on a first side of the at least one mold, the heating zone being superimposed on the cooling zone along an axis of the enclosure;
    a first movement system configured to move the at least one mold in the enclosure from the heating zone to the cooling zone along the axis of the enclosure;
    a second thermal screen movable with respect to the at least one mold, distinct from the first thermal screen and situated on a second side of the at least one mold opposite to the first side;
    a second movement system, distinct from the first movement system, configured to move the second thermal screen in the enclosure along the axis of the enclosure,
    an additional thermal screen movable with respect to the at least one mold and distinct from the first and second thermal screens, the additional thermal screen being situated on the second side of the at least one mold and being superimposed on the second thermal screen along the axis of the enclosure, the width of the additional thermal screen being less than the width of the second thermal screen, and
    a third movement system, distinct from the first and second movement systems, configured to move the additional thermal screen in the enclosure along the axis of the enclosure independently of the second thermal screen.

2. The installation according to claim 1, further comprising a third thermal screen fixed with respect to the enclosure, distinct from the first and second thermal screens and from the additional thermal screen, said third thermal screen being present in the heating zone and being superimposed on the first thermal screen along the axis of the enclosure.

3. The installation according to claim 1, comprising a plurality of molds intended to receive the melted material and present in the heating zone, said plurality of molds being present around the second thermal screen, the installation further comprising a heating system configured to heat the heating zone, the heating system and the first thermal screen being present around said plurality of molds.

4. A method for manufacturing at least one part by implementation of a Bridgman method and of the installation according to claim 1, the method comprising:
    introduction of a melted material into said at least one mold,
    directional solidification of the melted material by moving said at least one mold comprising the melted material from the heating zone toward the cooling zone along the axis of the enclosure by activating the first movement system, and
    movement of the second thermal screen along the axis of the enclosure by activating the second movement system so as to position the second thermal screen in front of the solidification front of the melted material during a first phase of the directional solidification, then the additional thermal screen being moved along the axis of the enclosure by actuation of the third movement system so as to position the additional thermal screen in front of the solidification front of the melted material during a second phase of the directional solidification.

5. The method according to claim 4, wherein the part is a turbomachine part.

6. The method according to claim 5, wherein the part is a turbomachine blade.

7. The method according to claim 4, wherein the melted material is a metal material or a ceramic material.

* * * * *